(12) United States Patent
Barber (10) Patent No.: US 7,173,328 B2
(45) Date of Patent: Feb. 6, 2007

(54) INTEGRATED CIRCUIT PACKAGE AND METHOD HAVING WIRE-BONDED INTRA-DIE ELECTRICAL CONNECTIONS

(75) Inventor: Ivor Barber, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 130 days.

(21) Appl. No.: 10/819,684

(22) Filed: Apr. 6, 2004

(65) Prior Publication Data

US 2005/0224964 A1 Oct. 13, 2005

(51) Int. Cl.
*H01L 23/48* (2006.01)

(52) U.S. Cl. .................. 257/694; 257/723; 257/688; 438/107; 438/117

(58) Field of Classification Search ........... 257/694
See application file for complete search history.

(56) References Cited

U.S. PATENT DOCUMENTS

| 5,371,405 | A | * | 12/1994 | Kagawa ............... 257/664 |
| 6,087,721 | A | * | 7/2000 | Akhnoukh et al. ......... 257/705 |
| 6,351,010 | B1 | * | 2/2002 | Yamanaka et al. ......... 257/350 |
| 6,424,034 | B1 | * | 7/2002 | Ahn et al. ............... 257/723 |
| 2002/0176239 | A1 | * | 11/2002 | Schoenbom ............ 361/780 |

\* cited by examiner

*Primary Examiner*—Leonardo Andujar
*Assistant Examiner*—Krista Soderholm
(74) *Attorney, Agent, or Firm*—Beyer Weaver & Thomas, LLP (57) ABSTRACT

A semiconductor package having a substrate mounted die. The die configured having active circuit components and a top surface having bond pads electrically connected with circuitry of the die. The bond pads commonly being formed above active circuit components. The bond pads being electrically interconnected with wire bonds to establish intra-chip electrical connection between circuitry of the die. Methods of forming such packages are also disclosed.

6 Claims, 4 Drawing Sheets

INTEGRATED CIRCUIT PACKAGE AND METHOD HAVING WIRE-BONDED INTRA-DIE ELECTRICAL CONNECTIONS

FIELD OF THE INVENTION

The present invention relates generally to integrated circuit packages and methods. More specifically, the present invention relates to packages having wire bonded electrical interconnections with a die or between the bonding pads of a die mounted with the package.

BACKGROUND

Semiconductor packaging technology is commonly characterized by the use of a substrate whose front side is mounted with a semiconductor die and whose back side is mounted with a grid array of solder balls. During assembly, wire bonding techniques are used to connect the die with electrical connections on the substrate.

Figure 1A:
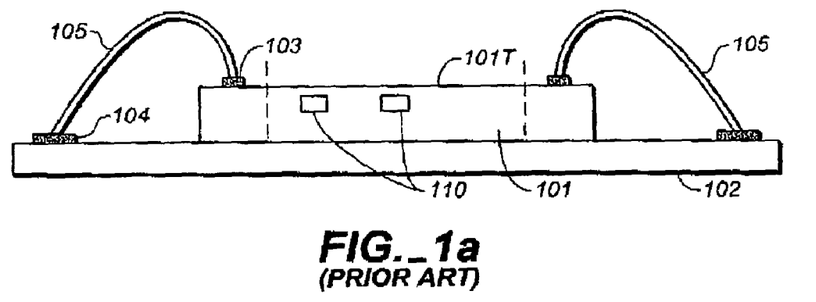
FIG. 1(a) (PRIOR ART) is a schematic sectional diagram showing the structure of a typical conventional semiconductor package.

FIG. 1(a) illustrates one commonly employed substrate configuration used in conventional packaging approaches. The depiction of FIG. 1(a) is schematic in nature and not necessarily to scale. The depicted package 100 includes a substrate 102 having a semiconductor die 101 mounted thereon. A variety of methods of mounting such dies are well known in the art.

The schematically depicted die 101 is shown including a few exemplar active components 110 schematically illustrated to show tat the active components 110 can be located inside the die 101. The reader is specifically reminded that this drawing is not necessarily to scale. Conventionally, such active components 110 are located just under a surface of the die. Typically, a multiplicity of bond pads 103 are formed on atop surface 101T of the die 101. Heretofore, these bond pads 103 have been formed only on the outer portions of the die 101. These bond pads 103 are electrically connected with substrate mounted electrical contacts 104 by means of wire bonds 105. Before now, the bond pads 103 have been arranged about the periphery of the die 101 to avoid being placed over the active components 110.

Figure 1B:
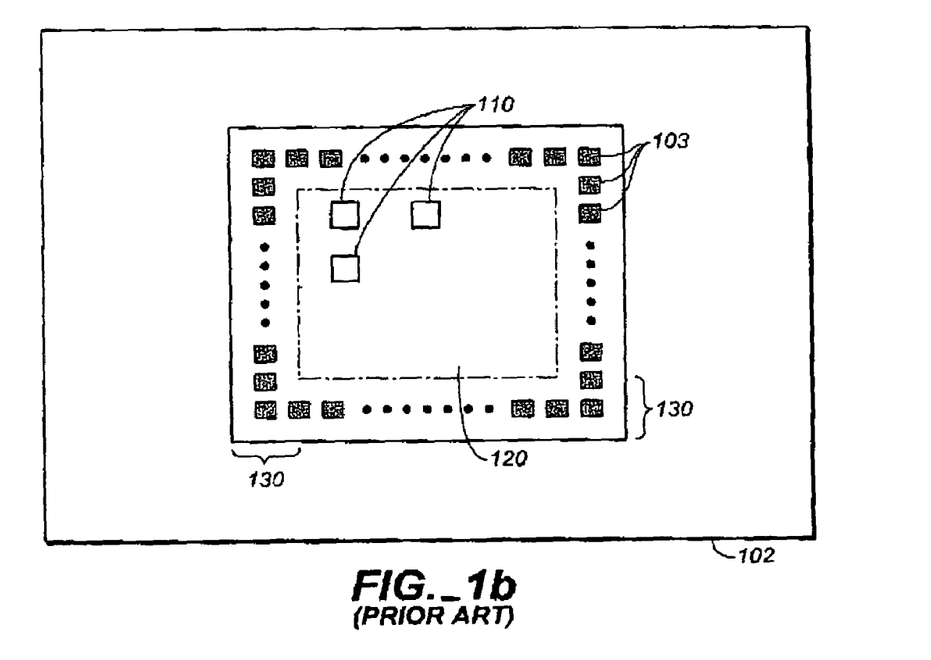
FIG. 1(b) (PRIOR ART) is a schematic top view showing the structure of a typical conventional semiconductor package of FIG. 1(a).

FIG. 1(b) is a schematic top down view of the conventional package 100 depicted in FIG. 1(a). The active circuit components 110 are commonly arranged in an inner portion 120 (the outer border of which is illustrated here by dotted/dashed line) of the die 101. The bond pads 103 are arranged at the outer periphery 130 of the die 101. This arrangement of bond pads 103 at the periphery 130 was previously necessary due to certain limitations in wire bonding technique. Wire bonding to bond pads above an active component frequently lead to failure of the underlying component. As a result, it is common practice to confine bond pads to the outer periphery of the die. Although advantageous from some standpoints, such a limitation commonly places a large majority of the die surface area off-limits to wire bonding. Thus, conventionally, the bond pads 103 are relegated to the outer periphery 130 of the die 101. In conventional approaches, more than one row of bond pads 103 can be used. In fact, in one conventional implementation, three rows of bond pads are used. In one common conventional implementation, using a die of about 8 millimeters (mm) square, the bond pads are confined to an outer periphery of 500 microns (μ) or less. Correspondingly, the entire inner portion 120 encircled by the pads 103 is not used to form bond pads suitable for wire bonding.

Current advances in wire bonding technologies have reduced the likelihood that active components located under bond pads will be damaged by the wire bonding process. The principles of the present invention seek to take advantage of this development. Thus, methodologies and apparatus constructed in accordance with the principles of the invention can be used to form novel packaging structures, some of which are detailed hereinbelow.

SUMMARY OF THE INVENTION

In accordance with the principles of the present invention, this disclosure teaches an integrated circuit package and method for package manufacture wherein the package includes wire bonded electrical connections to bond pads of a die wherein the bond pads are mounted above active circuit components.

A first embodiment includes a circuit package having a packaging substrate with a semiconductor integrated circuit die mounted thereon. The die includes a top surface. And the die includes a plurality of active circuit components formed therein. A plurality of bonding pads are formed on the top surface of the die with at least some of the bonding pads being formed above active circuit components of the die. The bonding pads are electrically connected with on-chip circuit elements. The includes wire bonded intra-chip electrical connections formed by a wire bonded electrical connection between the bonding pads associated with selected on-chip circuit elements to establish electrical connections between on-chip circuit elements.

In another embodiment the invention teaches an integrated circuit package having a packaging substrate with a semiconductor integrated circuit die mounted thereon. The die has a plurality of active circuit components formed therein. The die further includes a plurality of bonding pads formed on a top surface the die with at least some of the bonding pads being formed above active circuit components of the die. The bonding pads include: a first set of bonding pads electrically connected with a first set of on-chip circuit elements, a second set of bonding pads electrically connected with a second set of on-chip circuit elements, and a third set of bonding pads electrically connected with a third set of on-chip circuit elements. Such bonding pads are configured to enable a wire bonded intra-chip electrical connection between the first set of and one of the second set of bonding pads and the third set of bonding pads.

Another embodiment of the invention includes an integrated circuit package having a semiconductor integrated circuit die with active circuit components formed therein. The die including a plurality of bonding pads formed on a top surface the die. At least some of the bonding pads are formed above active circuit components of the die. The bonding pads are electrically connected with on-chip circuit elements. The bonding pads are arranged in a configuration of outer bond pads and inner bond pads placed so that outer bond pads are arranged near the periphery of the die and encircle the plurality of inner bond pads. The die having an off-chip electrical connection with an on-chip circuit element. The electrical connection being a wire bond between an off-chip electrical contact and a bonding pad on the die wherein the bonding pad is electrically connected with the on-chip circuit element.

In another embodiment, the disclosure teaches a method for providing intra-die electrical connections for a semiconductor die mounted in a semiconductor package. The method involves providing a packaging substrate having a die mounted thereon. The die includes a plurality of active circuit components, a top surface, on-chip circuit elements, and a plurality of bond pads. The bond pads are formed on a top surface of the die and electrically connected with on-chip circuit elements so that at least some of the bond pads are formed over active circuit components. The method further involves forming a wire bonded electrical connection between at least some of the bond pads to establish electrical connections between on-chip circuit elements associated with the wire bonded bond pads.

These and other aspects of the present invention are described in the detailed description of the embodiments set forth hereinbelow.

BRIEF DESCRIPTION OF DRAWINGS

The invention can be more fully understood by reading the following detailed description of the preferred embodiments, with reference made to the accompanying drawings, wherein.

It is to be understood that, in the drawings, like reference numerals designate like structural elements. Also, it is understood that the depictions in the Figures are not necessarily to scale.

DETAILED DESCRIPTION

Figure 2:
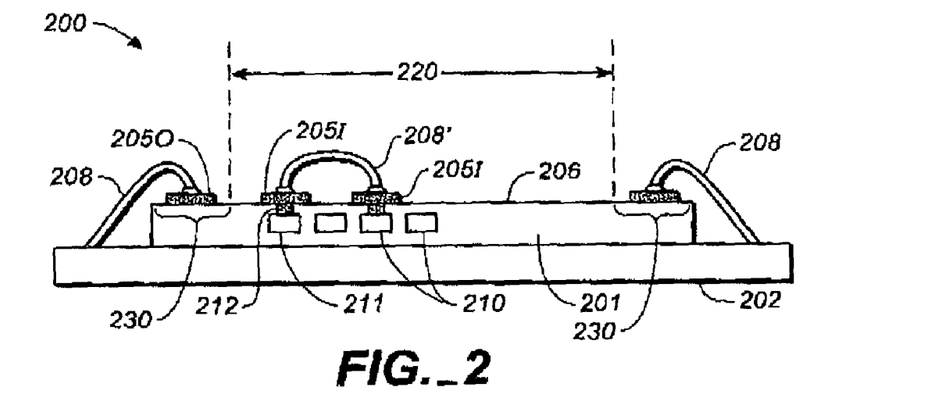
FIGS. 2 & 3 are simplified schematic side views of a portion of an embodiment of semiconductor packaging embodiments constructed in accordance with the principles of the invention.

FIG. 2 depicts a side view of one embodiment of a semiconductor package 200 constructed in accordance with the principles of the invention. The package includes a substrate 202 having a semiconductor integrated circuit die 201 mounted thereon. The substrate 202 can be formed of any type commonly used in the art. In the depicted example, the substrate 202 is formed of a plastic material (e.g., in a plastic ball grid array (PBGA) package) in accordance with ordinary fabrication techniques known to those having ordinary skill in the art. Of course, other substrate configurations and materials can be used. Typically, the die 201 is mounted on the front side of the substrate 202. The die 201 includes a plurality of outer bond pads 205 O formed on a top surface 206 of the die and arranged at peripheral regions 230 located near the edges of the die 201. The outer bond pads 205 O are electrically connected with the substrate 202 using wire bonds 208. In one non-limiting example, the plurality of outer bond pads 205 O are formed at peripheral regions 230 of the comprising, for example, the outer 500µ of the die. Such bond pads can be formed to wide array of dimensions but are typically formed having dimensions in the range of about 20–80µ.

The outer bond pads 205 O encircle a plurality of inner bond pads 205I arranged in a more centrally located inner portion 220 of the die 201. The inner bond pads 205I are formed at the die surface 206 and can be formed over active components 210. The inner bond pads 205I are electrically connected wit on-chip circuit elements. Such on-chip circuit elements can include the active circuit components 210 of the die and can include other circuit elements 211. Such active circuit components 210 can comprise any circuit element comprising a portion of the active circuitry of the die 201. Additionally, the other circuit elements 211 can include a vast array of electrical circuit elements. Examples include, but are not limited to simple circuit elements like electrical interconnect lines and individual components. Additionally, such other circuit elements include, but are not limited to, larger circuit devices and components of any variety. Typically, the inner bond pads 205I are electrically connected with such devices using via structures 212, but as is known to persons having ordinary skill in the art many other electrical connection methodologies can be employed. Important to some embodiments, intra-chip bond wires 208' electrically connect some electrical systems of the die 201 to one another. To the inventors understanding this has never been done before due to the inherent limitations of previous wire bonding technologies. In particular, previous wire bonding technologies had the unfortunate consequence of damaging active components if such elements were formed underneath bond pads subjected to wire bonding. Thus, in order to achieve such intra-chip wire bonding newer types of wire bonding machines should be employed. Such machines use techniques that do not cause significant damage to underlying active components. Examples, include Model FB 131, FB 137, and FB 118CH wire bonding machines manufactured by Kaijo of Tokyo, Japan. Also, Model 3100 and 3088 series wire bonding machines manufactured by ESEC of Switzerland can be used. In another non-limiting example, a KNS Maxµmpls T wire bonder (available from Kulicke & Soffa Industries, Inc. of Willow Grove, Pa.) can be employed. As is readily apparent to those having ordinary skill in the art other machines having similar properties can be employed. Moreover, other wire bonding tools of types known to persons having ordinary skill in the art can be employed.

In a typical embodiment, aluminum can be used as an inner bond pad 205I. Of course as is readily appreciated by those of ordinary skill many other materials can be used to provide suitable bond pads. Examples include, but are not limited to, bond pads formed of copper, copper/aluminum, as well as many other conductive alloy materials and layered conducting materials. Additionally, wire bonding can be achieved using gold wire. For example, 25µ gold wire is suitable. However, as is readily appreciated by those of ordinary skill many other materials can be used to provide suitable wire bonded connectors. For example, wire can be formed of copper, aluminum, copper/aluminum, aluminum/silicon, as well as many other conductive alloy materials. It is specifically pointed out that the inventor contemplates that many other materials known to those of ordinary skill in art can be used to practice the embodiments of the invention.

Once all the electrical connections are made (via wire bonding or otherwise), portions of die 201 and bond wires 208, 208' can be encapsulated by an encapsulant 330 (of a type commonly used in the semiconductor packaging art) to protect and encase the delicate inner components of the chip package. Details of the forgoing general embodiment will be discussed in later paragraphs.

Figure 3:
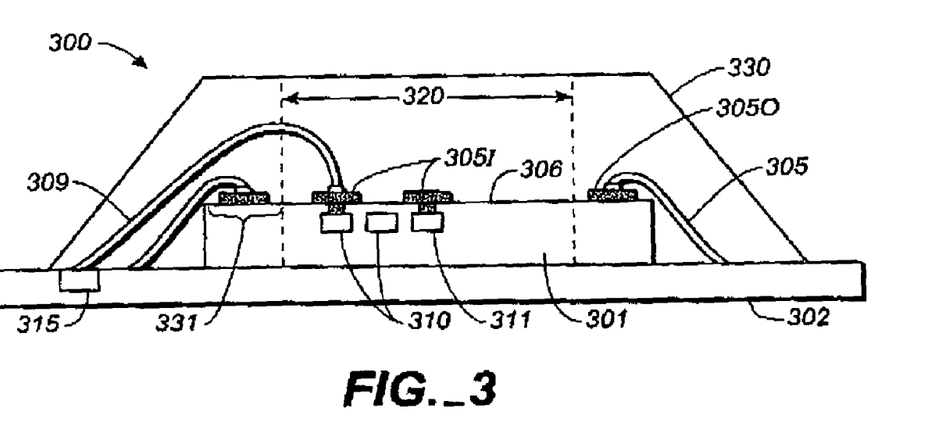

Another embodiment is described with reference to FIG. 3, which depicts a side view of another embodiment of a semiconductor package 300 constructed in accordance with the principles of the invention. The package 300 includes a substrate 302 having a semiconductor integrated circuit die 301 mounted thereon. As before substrate 302 can be formed using a wide range of materials and configurations as is known to persons having ordinary skill in the art. A die 301 is mounted on the substrate 302 and includes a plurality of outer bond pads 305 O formed on a top surface 306 of the die and arranged at peripheral regions 331 located near the edges of the die 301. The outer bond pads 305 O are electrically connected with the substrate 302 using wire bonds 305. As with the previous non-limiting example, the peripheral regions 330 can comprise the outer 500μ of the die.

The outer bond pads 305 O encircle a plurality of inner bond pads 305 I arranged in the more centrally located inner portion 320 of the die 301. The inner bond pads 305 I are formed at the die surface 306 and can be formed over active components 310. The inner bond pads 305 I are electrically connected with on-chip circuit elements. Such on-chip circuit elements can include the active components 310 of the die and can include other circuit elements 311. Typically, the inner bond pads 305 I are electrically connected with such devices using via structures, but as is known to persons having ordinary skill in the art many other electrical connection methodologies can be employed. Important to some embodiments, off-chip bond wires 309 electrically connect some electrical systems of the die to off-chip signal and voltage sources 315. In particular embodiments, the off-chip bond wires 309 are electrically connected die bond pads 305I near the middle of the die and not at the periphery. To the inventors understanding this has also never been done before due to the inherent limitations of previous wire bonding technologies. As before newer types of wire bonding machines should be employed. Examples, of such machines have been previously described. Many materials known to persons having ordinary skill in the art are suitable for such wire bonds 305, 309 and bond pads 305I, 305O including, but not limited to the previously described materials. Again, once all the electrical connections are made (via wire bonding or otherwise), portions of die and bond wires can be encapsulated by encapsulant materials to protect and encase the delicate inner components of the chip package 300. Details of the forgoing general embodiment will be discussed in later paragraphs. The inventor contemplates that the off-chip bonding can be used to establish wire bonded electrical connections from one chip to another. In one such embodiment, the bond pads in the central portion of one die can be wire bonded to bond pads in the central portion of another die.

Referring again to the generalized embodiment of FIG. 2, an integrated circuit package 200 embodiment can be configured to include intra-chip electrical connections between selected on-chip circuit elements. The connection is formed by a wire bond 208' used to establish a wire bonded electrical connection between two (or more) bonding pads 205I. The bonding pads 205I are associated with the on-chip circuit elements (e.g., 210, 211). The bonding pads can be formed over active circuit components 210 of the die 201. In one embodiment, the wire bond 208' can be used to establish a wire bonded voltage line between bonding pads 205I. As used here voltage lines refer to power lines or ground lines. For example, an electrical connector used to provide voltage to an on-chip bond pad 205I thereby establishing a power line. This power line can be used to provide electrical power to a circuit element connected with the bond pad. Such wire bonded voltage lines provide substantial advantages over conventional interconnects formed in the die 201. Typically, an interconnect line formed in a semiconductor die is on the order of about 1μ tall and about 2–5μ wide. This is to be compared to a wire bonded wire connector having an example diameter of about 25μ. Thus, far less resistance is encountered in a wire bonded electrical connection than is the case for most die-mounted electrical interconnect structures. This is significant because in most conventional implementations power and ground lines are connected at the edge of the die (chip) and then use conventional interconnects that route power (or ground) through the die 201. Thus, using the example of a power source, there is commonly a voltage drop from the edge of the die relative to the middle of the die 201. This problem is worsened as the internal interconnects of the die are routed around various structures within the die (thereby lengthening the conduction path) making the electrical path length longer. Similar effects are noted for ground connections. Therefore, intra-chip bond wire connections can be used to improve the voltage drop problems encountered in current technologies.

In certain conventional semiconductor dies, the voltage distribution is arranged in regions. For example, if more than one voltage level is used to power systems of the die, these systems can be clustered together in the same region with other systems requiring the same power level. This provides numerous advantages to the designer and minimizes the aforementioned voltage drop issues. However, such implementations place considerable design restrictions on a chip designer. Accordingly, the embodiments of the invention provide a method for overcoming this restrictive design constraint. Embodiments of the invention can be configured to allow circuitry having different voltage requirements to operate in the same region as circuitry of different voltage requirements.

Figure 4:
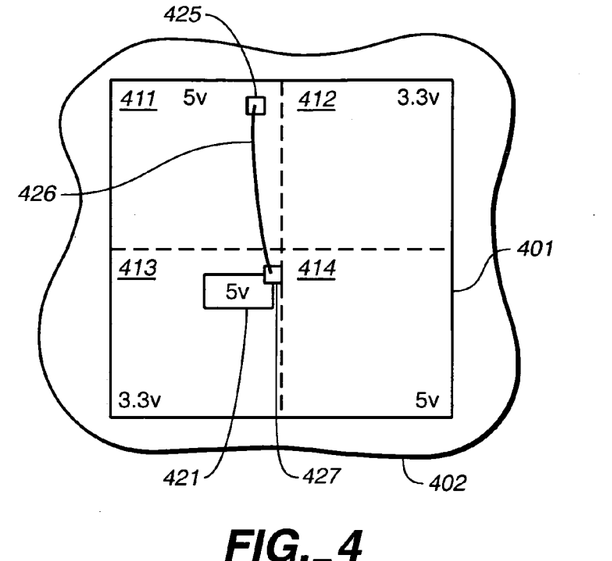
FIG. 4 is a simplified plan view of an implementation for a package using wire bonded intra-chip electrical connection to route power in accordance with the principles of the invention.

FIG. 4 illustrates one possible embodiment of the invention. FIG. 4 is a simplified schematic top down view of an embodiment of the invention. The depiction of FIG. 4 shows a simplified die 401 embodiment mounted on a substrate 402. Outer bond pads are typically present, but not shown in this view. Additionally, the wire bonded connections with the substrate are not shown in this simplified view. The depicted die 401 includes a multiplicity of regions 411, 412, 413, 414 that define different voltage regions. For example, all the electronic systems of regions 411 and 414 are configured to operate using a 5-volt (5 v) power source. Regions 412 and 413 are configured to accommodate systems that operate using a 3.3-volt (3.3 v) power source. However, if a designer wishes to add a 5 v system 421 to a 3.3 v region 413 it is not easily accomplished using conventional techniques.

In the depicted embodiment, a wire-bonded electrical connection can be used to electrically connect the 5v system 421 with a 5v power source of region 411. A first bond pad 425 is electrically connected with a 5v power source. Such a bond pad 425 can be formed using ordinary methods and is typically connected with a power source (which can be a power generation source or a electrical line connected with a power generation source). Another bond pad 427 is electrically connected with the 5 v system 421. Typically, the bond pad 427 is positioned near the 5v system 421 and electrically connected thereto, typically, but not exclusively, using a via. A wire 426 is wire bonded to the bond pads 425, 427 to establish an electrical connection between the 5v region 411 and 5v region 421. Similar arrangements can be used to arrange grounding for systems using bond wires.

In another implementation of the principles of the invention, wire bond can be used to establish intra-chip electrical connections between on-chip circuit elements in order to propagate signals from one circuit element to another. Such signals can include input/output (I/O) signals between electronic components or circuit elements of the die.

In conventional dies, circuit elements of the die are commonly interconnected using via and interconnect structures that are routed through the structure of the die. Such routing must take into account the presence of large dense circuit structures already formed on the die. Many different types of circuit structures pose such routing challenges. In one example, memory structures comprise such difficult to route around structures. Thus, in common implementations, these large dense structures are typically mounted at the edges of dies. This imposes significant limitations of semiconductor die design. For example, in cases where it can be advantageous to place a dense circuit structure (e.g., a memory array) in the middle of the die, such placement presents a significant circuit routing challenge to be overcome by a designer. In particular, path length inequalities resulting from the presence of such a large dense circuit structure can lead to synchronization issues for the circuit components or elements involved.

Figure 5A:
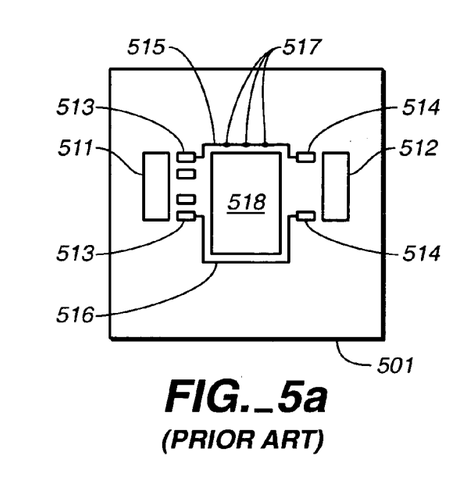
FIGS. 5(a)(PRIOR ART) & 5(b) are simplified plan views of yet another example of a semiconductor package embodiment constructed in accordance with the principles of the invention.
Figure 5B:
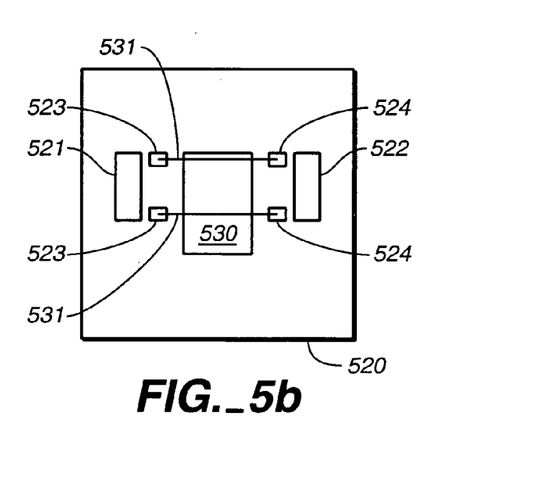

FIGS. 5(a) and 5(b) illustrate solutions to this problem presented by some embodiments of the invention. FIG. 5(a) depicts a top-down view of a die 501 illustrating aspects of the above-described problem. A first electronic component 511 and a second electronic component 512 are mounted with the die 501. The first electronic component 511 is electrically connected with an associated set of contacts 513. The second electronic component 512 is electrically connected with another associated set of contacts 514. If an electrical connection between the first electronic component 511 and the second electronic component 512 is desired, interconnects 515, 516 can be used. Unfortunately, due to the presence of a large dense intervening circuit element 518, the interconnects 515, 516 must be routed around the component 512. In order to effect such a routing the electrical path length of the first interconnect 515 is shorter than the electrical path length of the second interconnect 516. This can lead to synchronization issues because signals emitted simultaneously at the first electronic component 511 will not arrive simultaneously at the second component 512. Delay cells 517 are sometimes used to overcome these problems. Some embodiments of the invention can be used to overcome these difficulties. A few illustrative examples are set forth below.

The embodiment of FIG. 5(b) solves some of the foregoing issues. FIG. 5(b) is a simplified schematic top-down depiction of a die 520. Again, a first electronic component 521 and a second electronic component 522 are mounted with the die 520. A large dense circuit structure 530 is formed on the die 520. The first electronic component 521 is electrically connected with an associated set of bond pads 523 on a top surface of the die 520. The second electronic component 522 is electrically connected with another associated set of bond pads 524 on a top surface of the die 520. The bond pads 523, 524 are electrically connected using wire-bonded wires 531. The length of the wires 531 are selected to form electrical pats of substantially the same length between the first electronic component 521 and the second component 522. In this way synchronization can be easily achieved. The lengths of wires can be readily adjusted to accommodate virtually all path length issues in accordance with the principles of the invention. Such configurations obviate the need for delay cells. Such implementations find particular utility when the first electronic component 521 comprises a clock or other timing related device. Moreover, the depicted embodiments also find particular utility when used with any group of timing sensitive electronic components. However, the inventor points out that the depicted embodiment is not limited to such devices and can be utilized to electrically interconnect all types of electrical components and circuit elements.

Another implementation of the principles of the present invention is discussed with respect to the following Figures. In particular, embodiments of the present invention can be used in semiconductor packages that are configured having more than one possible functionality. Such packages can be manufactured having several possible functions. The precise function is not chosen until a final wire bonding configuration is implemented in accordance with the principles of the invention. This principle is illustrated in general form in the following figures.

Figure 6:
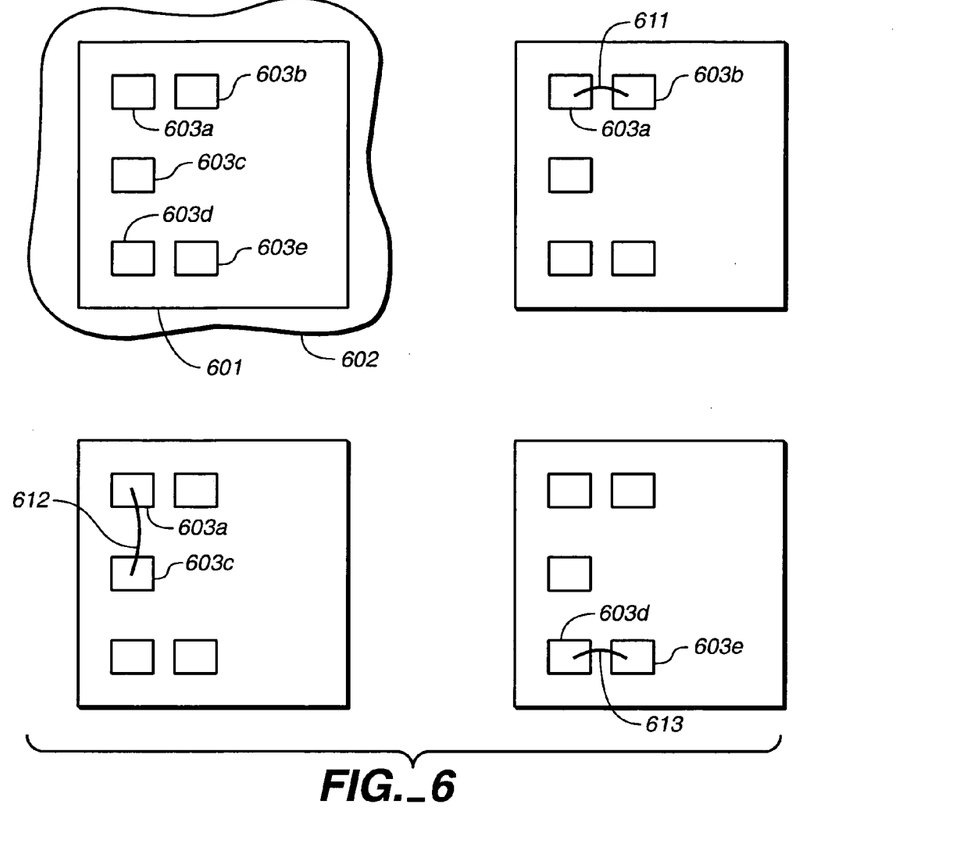
FIG. 6 is a simplified plan view of yet another example of a semiconductor package embodiment utilizing alternative functionalities in accordance with the principles of the invention.

FIG. 6 is a very simplified schematic illustration used to illustrate certain aspects of embodiments of the invention. The depicted embodiments are simplified top down views of die embodiments constructed in accordance with the principles of the invention. Die 601 is a semiconductor die mounted on a packaging substrate 602. The die has been manufactured using ordinary semiconductor processing techniques. All electronic components internal to the die are completely manufactured and bond pads 603a, 603b, 603c, 603d, 603e are formed on a top surface of the die 601 and electrically connected with on-chip circuit devices (not shown in this view). The depicted die 601 has been constructed so that its final functions are determined by a final wire-bonding configuration. The function of the die is determined by how the on-chip circuit devices are interconnected using wire bonds between bond pads 603a, 603b, 603c, 603d, 603e. Thus, the die 601 (or packages) can be mass-produced in a "programmable" form. These programmable dies (or packages) can be finally configured at some later time in accordance with the desires or needs of an end user. Once "programmed" by making the final wire bonds, the package can be encapsulated and used.

In the depicted embodiment, bond pads 603a, 603b, 603c, 603d, 603e are schematically depicted and may represent one bond pad or a set of many bond pads. The bond pads 603a, 603b, 603c, 603d, 603e may also be electrically connected with one electronic component of the die or many such components. The precise interconnections between bond pads determine the final functionality of the die 601. For example, in implementation A, if bond pads 603a and 603b are interconnected by wire bond 611 a first functionality for the chip can be defined. For example, an ASIC for measuring a flow rate of a fluid. Alternatively, in implementation B, if bond pads 603a and 603c are interconnected by wire bond 612 another functionality for the chip can be defined. For example, an ASIC for measuring a temperature. In another example alternative, in implementation C, if bond pads 603d and 603e are interconnected by wire bond 613 another functionality for the chip can be defined. For example, the chip now functions as a clocking device. Such multi-role implementations can be very useful allowing last minute changes in functionality to accommodate user needs. Moreover, such die (or packages) can be manufactured, sit on a shelf, and then be implemented when needed.

The packages of the present invention can include the entire array of packaging devices including, but not limited to, ball grid array (BGA) packages, PBGA packages, enhanced plastic ball grid array (EPBGA) packages, plastic quad flatpack (PQFP) packages, and the like. The back sides of typical substrates 302, 302 typically include a plurality of solder balls formed thereon (not shown in these views).

Figure 7:
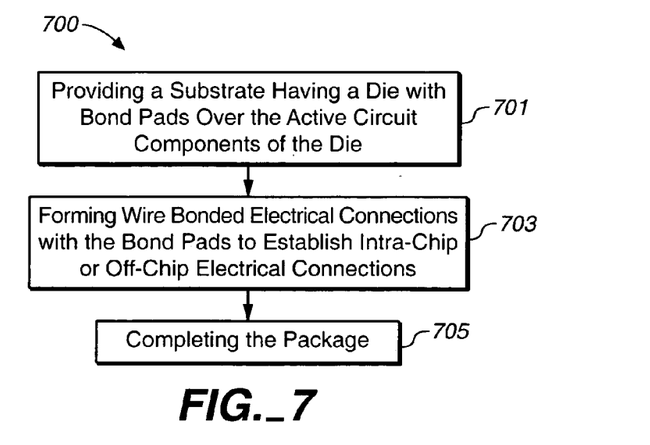
FIG. 7 is a simplified flow diagram illustrating a method for manufacturing a semiconductor package embodiment in accordance with the principles of the invention.

Embodiments of the invention further include a method for providing intra-die electrical connections for a semiconductor die mounted in a semiconductor package. FIG. 7 is a flow diagram illustrating one embodiment of such a method. The method begins by providing a suitable substrate (Step 701). In one embodiment, such a substrate includes a packaging substrate having a die mounted thereon. A suitable die embodiment includes a plurality of active circuit components and on-chip circuit elements. The active circuit components and the on-chip circuit elements can be the same or different electronic components. The die has a top surface formed over the active circuit components. Bond pads electrically connected with the on-chip circuit elements are formed on the top surface and can be formed over formed over active circuit components if desired. Wire bonded electrical connections are formed with the bond pads to establish intra-chip or off-chip electrical connections (Step 703). For example, electrical connections between various on-chip circuit elements can be established using wire bonds to the bond pads. Such wire bonds can be between on-chip circuit elements to establish intra-chip electrical connection. Alternatively, or additionally, electrical connections between on-chip circuit elements to off-chip circuitry can be established using wire bonds. The resulting wire bonded die is then encapsulated to complete the package (Step 705).

In some implementations, alternative approaches can be used. For example, when it is desired to produce a package having a die with several different possible functionalities, the following approach can be used. The step of providing a packaging substrate (Step 701) includes providing a substrate wherein the bond pads of the die are configured to enable different electronic functionalities for the die. The different functionalities are enabled by employing different bond pad connection configurations to selectively connect various bond pads (and their associated electrical components) using wire bonded electrical interconnections. Also, forming wire bonded electrical connections (Step 703) includes choosing a desired functionality for the die. The user determines which components should be interconnected to accomplish the desired functionality. Normally, this is accomplished using some preset pattern of interconnections between a selected set of bond pads. Simply the desired pattern is chosen. Then the selected bond pads are interconnected with wire bonds to establish the desired functionality for the die.

Additionally, when it is desired to produce a die with several different possible functionalities for use with packages, the following approach can be used. A die is provided wherein the bond pads of the die are configured to enable different electronic functionalities for the die. The different functionalities are enabled by employing different bond pad connection configurations to selectively connect various bond pads (and their associated electrical components) using wire bonded electrical interconnections. These wire bonded electrical connections are chosen to enable a desired functionality for the die. The user determines which intra-die components should be interconnected to accomplish the desired functionality. Normally, this is accomplished using some preset pattern of interconnections between a selected set of bond pads. The desired pattern is selected and the appropriate connections are made at the pleasure of the user to establish the desired functionality for the die.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "at least one". Furthermore, the embodiments illustratively disclosed herein can be practiced without any element which is not specifically disclosed herein.

What is claimed is:

1. An integrated circuit package comprising:
    a semiconductor integrated circuit die mounted with a packaging substrate having a plurality of active circuit elements formed therein, the circuit elements including clocking circuitry that is spatially separated from selected other on-chip circuit elements, wherein a space on the die between the clocking circuitry and the selected other on-chip circuit elements is occupied by intervening circuitry;
    a plurality of bonding pads formed on a top surface the die with at least some of the bonding pads being formed above active circuit elements of the die and being electrically connected with the clocking circuitry and the selected other on-chip circuit elements;
    and
    an intra-chip electrical connection between the clocking circuitry and the selected other on-chip circuit elements, the connection formed by a wire bonded electrical connection between two of the bonding pads associated with the clocking circuitry and the selected other on-chip circuit elements, wherein the wire-bonded electrical connection passes above the intervening circuitry and wherein the bonding pads are formed over at least one active circuit component of the die and wherein the wire bonded electrical connections between the clocking circuitry and the selected other on-chip circuit elements are selected having electrical path lengths configured to maintain synchronization between the clocking circuitry and the other on-chip circuit elements.

2. The integrated circuit package of claim 1 wherein the wire bonded electrical connections between the clocking circuitry and the other on-chip circuit elements each have substantially the same electrical path lengths.

3. An integrated circuit package comprising:
    a packaging substrate selected from among a ball grid array (BGA) substrate, a plastic ball grid array (PBGA) substrate, an enhanced plastic ball grid array (EPBGA) substrate, and plastic quad flatpack (PQFP) substrate;
    a semiconductor integrated circuit die mounted with the packaging substrate, the die having,
        a plurality of active circuit components formed therein, a plurality of bonding pads formed on a top surface the die with at least some of the bonding pads being formed above active circuit components of the die and being electrically connected with on-chip circuit elements the die, the die further including, a first power region having a first set of circuitry located therein, the first set of circuitry configured to operate using power of a first power level, wherein the first power region is configured to supply the first set of circuitry with power having said first power level, a second power region located at a different part of the die from the first power region, the second power region having a second set of circuitry located therein, the second set of circuitry configured to operate using power at a second power level, a third set of electronic circuitry located in the first power region of the die and configured to operate at the second power level, a first bond pad of said bond pads being formed in the first power region and above active circuit elements of the die and being electrically connected with the third set of electronic circuitry located in the first power region, a second bond pad of said bond pads being formed in the second power region and above active circuit elements of the die and being electrically connected with the second power level of the second power region, an intra-chip electrical connection to provide power having said second power level to the third set of electronic circuitry in the first power region, the connection formed by a wire bonded electrical connection between said first and second bonding pads.

4. The integrated circuit package of claim 3 wherein the second power region includes a power source configured to provide power at the second power level wherein the power source provides the second bond pad with power having the second power level and thereby the intra-chip electrical connection provides said second power level to the third set of electronic circuitry.

5. The integrated circuit package of claim 4 wherein die and the intra-chip electrical connection is encapsulated with an encapsulant material.

6. The integrated circuit package of claim 4 wherein the intra-chip electrical connection providing power having the second power level to the third set of electronic circuitry comprises a gold wire about 25 micrometers thick.

* * * * *